US011032959B2

(12) United States Patent
Minoshima et al.

(10) Patent No.: US 11,032,959 B2

(45) Date of Patent: Jun. 8, 2021

(54) COMPONENT MOUNTING MACHINE

(71) Applicant: FUJI CORPORATION, Chiryu (JP)

(72) Inventors: Nobuaki Minoshima, Togo-cho (JP); Mitsuhiko Shibata, Toyota (JP)

(73) Assignee: FUJI CORPORATION, Chiryu (JP)

( * ) Notice: Subject to any disclaimer, the term of this patent is extended or adjusted under 35 U.S.C. 154(b) by 145 days.

(21) Appl. No.: 16/466,852

(22) PCT Filed: Dec. 12, 2016

(86) PCT No.: PCT/JP2016/086912

§ 371 (c)(1),
(2) Date: Jun. 5, 2019

(87) PCT Pub. No.: WO2018/109807

PCT Pub. Date: Jun. 21, 2018

(65) Prior Publication Data

US 2020/0068756 A1 Feb. 27, 2020

(51) Int. Cl.
*H05K 13/04* (2006.01)
*H05K 13/08* (2006.01)

(52) U.S. Cl.
CPC ......... *H05K 13/0408* (2013.01); *H05K 13/08* (2013.01)

(58) Field of Classification Search
CPC ........................... H05K 13/0408; H05K 13/08
See application file for complete search history.

(56) References Cited

U.S. PATENT DOCUMENTS 6,161,277 A * 12/2000 Asai ..................... H05K 13/041 29/740
8,578,595 B2 * 11/2013 Kodama ............ H05K 13/0404 29/739
9,363,936 B2 * 6/2016 Kodama ................ H05K 13/08
(Continued)

FOREIGN PATENT DOCUMENTS

CN 1708217 A 12/2005
JP 06-196546 A * 7/1994
JP 11-163596 A 6/1999
(Continued)

OTHER PUBLICATIONS

International Search Report dated Mar. 14, 2017 in PCT/JP2016/086912 filed on Dec. 12, 2016.
(Continued)

*Primary Examiner* — Carl J Arbes
(74) *Attorney, Agent, or Firm* — Oblon, McClelland, Maier & Neustadt, L.L.P.

(57) ABSTRACT

A component mounting machine includes a mounting head configured to select and execute an individual mode in which lifting and lowering is performed for each of multiple holding tools, each of which holds a component and a collective mode in which the holding tools are lifted and lowered collectively; a memory section configured to store multiple collective lifting and lowering scheduled groups in each of which the components of which the number is the same as the number of holding tools are grouped; and a control section configured to subsequently execute holding of the component by the holding tool, dipping of the component into a coating agent, and mounting of the component on a board.

7 Claims, 8 Drawing Sheets

16 50 52 18 10 12 20 22 66 24 54 60 20 56 70 68 56 L 38 32 34 14 30 Y Z X 54 62 60

(56) References Cited

U.S. PATENT DOCUMENTS

| | | | | |
|---|---|---|---|---|
| 9,374,935 | B2 * | 6/2016 | Iwaki ................ | H05K 13/0495 |
| 9,854,684 | B2 * | 12/2017 | Hara ................. | H05K 13/0061 |

FOREIGN PATENT DOCUMENTS

| | | | | |
|---|---|---|---|---|
| JP | 2000-188498 | A | | 7/2000 |
| JP | 4147540 | | * | 12/2007 |
| JP | 4147543 | | * | 1/2008 |
| JP | 4369987 | | * | 3/2009 |
| JP | 4314310 | B | * | 8/2009 |
| JP | 4592723 | B | * | 12/2010 |
| JP | 2013-51307 | A | | 3/2013 |
| WO | WO 2012/136733 | A1 | | 10/2012 |

OTHER PUBLICATIONS

Extended European Search Report dated Nov. 8, 2019 in Patent Application No. 16924030.6, 9 pages.

Dieter Friedrich, et al., "SMT-the New Surface Mount Technology for Printed Circuit Boards" Siemens Components, vol. XXI, No. 6, XP001454616, Dec. 1, 1986, pp. 211-221.

* cited by examiner

FIG. 6
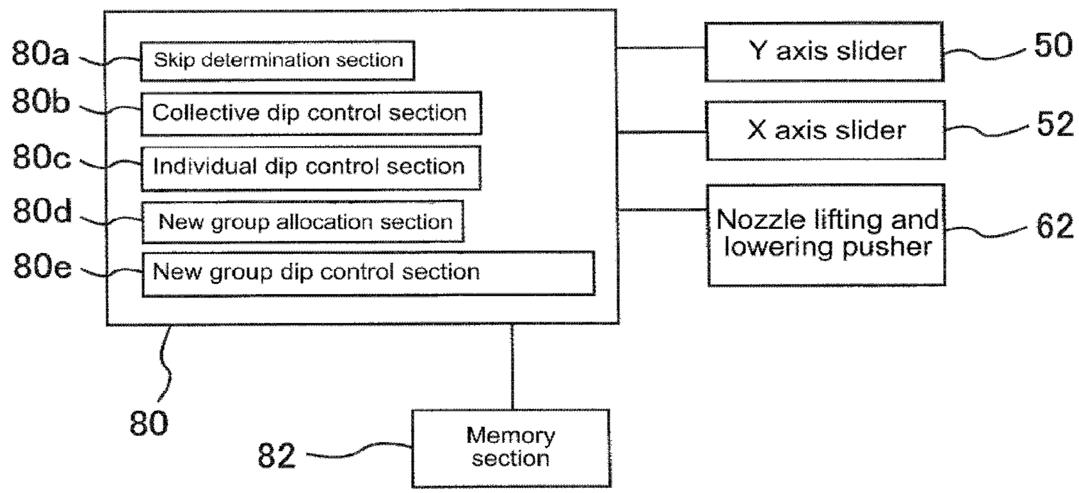
FIG. 7
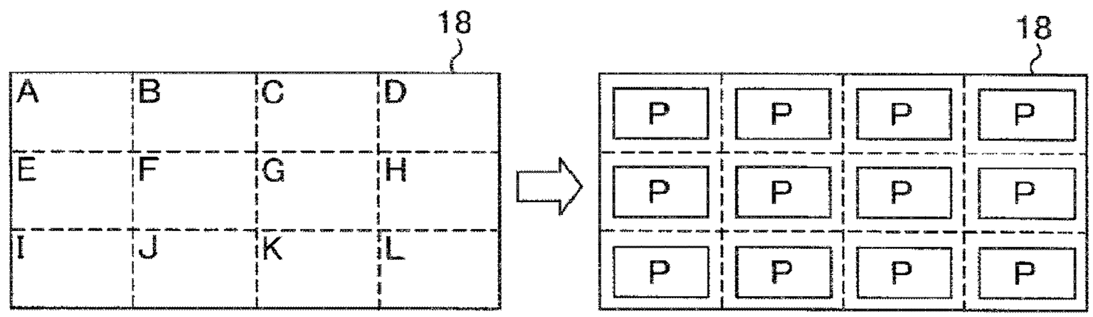
FIG. 8
| PP cycle | Divided board section | Component type | Mounting coordinates | | Skip information | Recovery information | Dip time |
|---|---|---|---|---|---|---|---|
| | | | X | Y | | | |
| 1PP | A | P | 10 | 10 | | | 1 sec |
| | B | P | 20 | 10 | | | |
| | C | P | 30 | 10 | | | |
| | D | P | 40 | 10 | | | |
| 2PP | E | P | 10 | 16 | | | 1 sec |
| | F | P | 20 | 16 | | | |
| | G | P | 30 | 16 | | | |
| | H | P | 40 | 16 | | | |
| 3PP | I | P | 10 | 22 | | | 1 sec |
| | J | P | 20 | 22 | | | |
| | K | P | 30 | 22 | | | |
| | L | P | 40 | 22 | | | |

FIG. 9
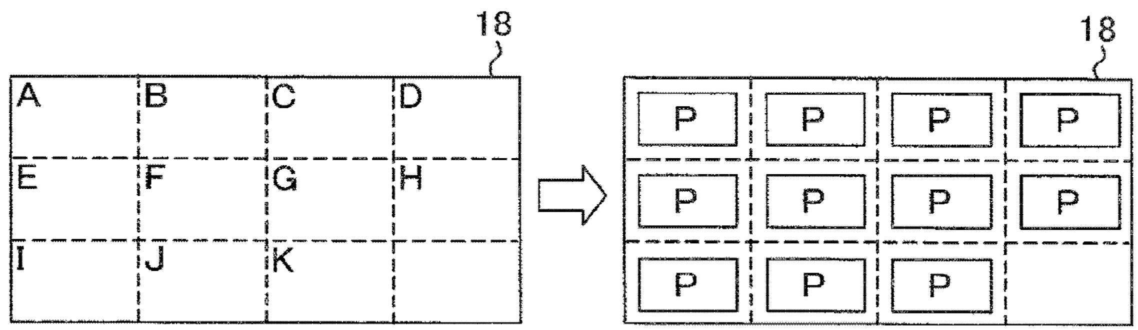
FIG. 10
| PP cycle | Divided board section | Component type | Mounting coordinates | | Skip information | Recovery information | Dip time |
|---|---|---|---|---|---|---|---|
| | | | X | Y | | | |
| 1PP | A | P | 10 | 10 | | | 1 sec |
| | B | P | 20 | 10 | | | |
| | C | P | 30 | 10 | | | |
| | D | P | 40 | 10 | | | |
| 2PP | E | P | 10 | 16 | | | 1 sec |
| | F | P | 20 | 16 | | | |
| | G | P | 30 | 16 | | | |
| | H | P | 40 | 16 | | | |
| 3PP | I | P | 10 | 22 | | | 3 secs |
| | J | P | 20 | 22 | | | |
| | K | P | 30 | 22 | | | |
| | | | | | | | |
FIG. 11
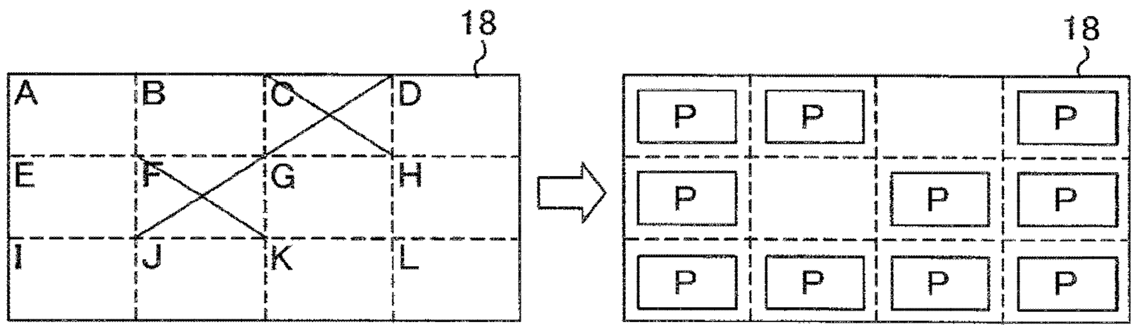

FIG. 12

| PP cycle | Divided board section | Component type | Mounting coordinates | | Skip information | Recovery information | Dip time |
|---|---|---|---|---|---|---|---|
| | | | X | Y | | | |
| 1PP | A | P | 10 | 10 | | | 3 secs |
| | B | P | 20 | 10 | | | |
| | C | P | 30 | 10 | S | | |
| | D | P | 40 | 10 | | | |
| 2PP | E | P | 10 | 16 | | | 3 secs |
| | F | P | 20 | 16 | S | | |
| | G | P | 30 | 16 | | | |
| | H | P | 40 | 16 | | | |
| 3PP | I | P | 10 | 22 | | | 1 sec |
| | J | P | 20 | 22 | | | |
| | K | P | 30 | 22 | | | |
| | L | P | 40 | 22 | | | |

FIG. 13

| PP cycle | Divided board section | Component type | Mounting coordinates | | Skip information | Recovery information | Dip time |
|---|---|---|---|---|---|---|---|
| | | | X | Y | | | |
| 1PP | A | P | 10 | 10 | | R | – |
| | B | P | 20 | 10 | | R | |
| | C | P | 30 | 10 | S | | |
| | D | P | 40 | 10 | | R | |
| 2PP | E | P | 10 | 16 | | R | – |
| | F | P | 20 | 16 | S | | |
| | G | P | 30 | 16 | | R | |
| | H | P | 40 | 16 | | R | |
| 3PP | I | P | 10 | 22 | | | 1 sec |
| | J | P | 20 | 22 | | | |
| | K | P | 30 | 22 | | | |
| | L | P | 40 | 22 | | | |
| 4PP | A | P | 10 | 10 | | | 1 sec |
| | B | P | 20 | 10 | | | |
| | D | P | 40 | 10 | | | |
| | E | P | 10 | 16 | | | |
| 5PP | G | P | 30 | 16 | | | 2 secs |
| | H | P | 40 | 16 | | | |
| | | | | | | | |
| | | | | | | | |

Recovery

| PP cycle | Divided board section | Component type | Mounting coordinates | | Skip information | Recovery information | Dip time |
|---|---|---|---|---|---|---|---|
| | | | X | Y | | | |
| 1PP | A | P | 10 | 10 | | R | – |
| | B | P | 20 | 10 | | R | |
| | C | P | 30 | 10 | S | | |
| | D | P | 40 | 10 | | R | |
| 2PP | E | P | 10 | 16 | | R | – |
| | F | P | 20 | 16 | S | | |
| | G | P | 30 | 16 | | R | |
| | H | P | 40 | 16 | | R | |
| 3PP | I | P | 10 | 22 | | | 1 sec |
| | J | P | 20 | 22 | | | |
| | K | P | 30 | 22 | | | |
| | A | P | 10 | 10 | | | |
| 4PP | B | P | 20 | 10 | | | 1 sec |
| | D | P | 40 | 10 | | | |
| | E | P | 10 | 16 | | | |
| | G | P | 30 | 16 | | | |
| 5PP | H | P | 40 | 16 | | | 1 sec |
| | | | | | | | |
| | | | | | | | |
| | | | | | | | |

Recovery

FIG. 17

| PP cycle | Divided board section | Component type | Mounting coordinates | | Skip information | Recovery information | Dip time |
|---|---|---|---|---|---|---|---|
| | | | X | Y | | | |
| 1PP | A | P1 | 8 | 10 | | R | – |
| | B | P1 | 18 | 10 | | R | |
| | C | P1 | 28 | 10 | S | | |
| | D | P1 | 38 | 10 | | R | |
| 2PP | A | P2 | 12 | 10 | | R | – |
| | B | P2 | 22 | 10 | | R | |
| | C | P2 | 32 | 10 | S | | |
| | D | P2 | 42 | 10 | | R | |
| 3PP | E | P1 | 8 | 16 | | R | – |
| | F | P1 | 18 | 16 | S | | |
| | G | P1 | 28 | 16 | | R | |
| | H | P1 | 38 | 16 | | R | |
| 4PP | E | P2 | 12 | 16 | | R | – |
| | F | P2 | 22 | 16 | S | | |
| | G | P2 | 32 | 16 | | R | |
| | H | P2 | 42 | 16 | | R | |
| 5PP | I | P1 | 8 | 22 | | | 1 sec |
| | J | P1 | 18 | 22 | | | |
| | K | P1 | 28 | 22 | | | |
| | L | P1 | 38 | 22 | | | |
| 6PP | I | P2 | 12 | 22 | | | 1 sec |
| | J | P2 | 22 | 22 | | | |
| | K | P2 | 32 | 22 | | | |
| | L | P2 | 42 | 22 | | | |
| 7PP | A | P1 | 8 | 10 | | | 1 sec |
| | B | P1 | 18 | 10 | | | |
| | D | P1 | 38 | 10 | | | |
| | E | P1 | 8 | 16 | | | |
| 8PP | G | P1 | 28 | 16 | | | 2 secs |
| | H | P1 | 38 | 16 | | | |
| | | | | | | | |
| | | | | | | | |
| 9PP | A | P2 | 12 | 10 | | | 1 sec |
| | B | P2 | 22 | 10 | | | |
| | D | P2 | 42 | 10 | | | |
| | E | P2 | 12 | 16 | | | |
| 10PP | G | P2 | 32 | 16 | | | 2 secs |
| | H | P2 | 42 | 16 | | | |
| | | | | | | | |
| | | | | | | | |

Recovery

COMPONENT MOUNTING MACHINE

TECHNICAL FIELD

The present application relates to a component mounting machine.

BACKGROUND ART

There are component mounting machines for mounting a component such as an electronic component on a board (for example, refer to Patent Literature 1). Such component mounting machines include a mounting head. The mounting head is movable in a horizontal plane in a conveyance direction of the board and a direction orthogonal to the conveyance direction. The mounting head holds a nozzle capable of holding a component. The mounting head is capable of moving the nozzle in a vertical direction. The mounting head picks up the component from a feeder holding the component by using the nozzle, and mounts the component on the board.

There is a mounting head that holds multiple nozzles. In a component mounting machine including a mounting head for holding multiple nozzles, after all the nozzles have picked up a component, dipping to apply a coating agent such as a solder paste or flux to the components may be performed before mounting the components on a board (for example, refer to Patent Literature 2). In the dipping, the component is brought into contact with a transfer surface of a tank holding the coating agent, by lifting and lowering the nozzle such that the coating agent is transferred to the component. In this component mounting machine, the coating agent is applied to all the components at the same time by collectively lifting and lowering all the nozzles while they are holding the components, at the same time. Therefore, the efficiency of the dipping can be improved.

In addition, multiple divided board sections on which electronic components are mounted in a repetitive pattern may be formed on one board (for example, refer to Patent Literature 3). In a case where a specific divided board section has some factor such as a scratch, for example, a component may not be mounted on the specific divided board section. In this case, skip information is stored in a production job corresponding to the specific divided board section. In the production job including the skip information, the nozzle does not pick up the component, and the component is not mounted on the corresponding divided board section. Then, the components are mounted only on the divided board sections corresponding to the production jobs that do not include the skip information.

PATENT LITERATURE

Patent Literature 1: JP-A-11-163596
Patent Literature 2: JP-A-2000-188498
Patent Literature 3: JP-A-2013-51307

BRIEF SUMMARY

Technical Problem

However, in a case where a component is mounted on a divided board section after the component is dipped into a coating agent, all the components are dipped into the coating agent at the same time by collectively lifting and lowering all the nozzles while they are holding the components, at the same time, in accordance with the production job. Thereafter, the components are mounted on the corresponding divided board section.

On the other hand, in a case where the skip information is included in the production job corresponding to the specific divided board section, pickup of the component by the nozzle corresponding to the specific divided board section is skipped. If a nozzle that is not holding a component is collectively lifted and lowered together with a nozzle that is holding the component at the same time for the application of the coating agent, there is a concern such that the coating agent may adhere to the nozzle that is not holding the component.

Therefore, in order to prevent the coating agent from adhering to the nozzle that is not holding a component during the dipping, one may consider performing individual dipping of lifting and lowering each nozzle that is holding a component such that the coating agent is applied to the component. With this individual dipping, it is possible to apply the coating agent to the component of nozzles holding a component, without the coating agent adhering to the nozzle that is not holding a component.

However, if the individual dipping of lifting and lowering each nozzle holding the component is always performed for the purpose of preventing the coating agent from adhering to the nozzle that is not holding a component, as the number of nozzles of the mounting head increases, for example four or eight nozzles, the number of the nozzles holding a component increases, and longer period of time is required from the start to the end of the dipping.

An object of the present disclosure is to provide a component mounting machine that reliably performs dipping to apply a coating agent to all the required components, and shortens the time required for the dipping as much as possible in a case where pickup of a component by a nozzle is skipped due to some factor.

Solution to Problem

The present description discloses a component mounting machine comprising: a mounting head configured to hold multiple holding tools each of which is configured to hold a component, and select and execute an individual mode, in which lifting and lowering is performed for each holding tool, and a collective mode, in which all the holding tools are lifted and lowered collectively; a memory section configured to store multiple groups, which are grouped in advance and in each of which the number of the components is the same as the number of holding tools, as a collective lifting and lowering scheduled group; and a control section configured to subsequently execute holding of the components by the holding tools, dipping of the components into a coating agent, and mounting of the components on a board, wherein the control section includes: a collective dip control section configured to perform the dipping for the collective lifting and lowering scheduled group in the collective mode in a case where a component for which the holding by the holding tool is to be skipped is not included in the collective lifting and lowering scheduled group, a new group allocation section configured to prohibit the holding of the component by the holding tool in the collective lifting and lowering scheduled group, in a case where the component for which the holding by the holding tool is to be skipped is included in the collective lifting and lowering scheduled group, and allocate the component for which the holding by the holding tool is not to be skipped in the collective lifting and lowering scheduled group, as the component in a new group, and a new group dip control section configured to perform the dipping for the new group in the collective mode, in a case where the components, of which number is the same as the number of holding tools, are allocated as the components in the new group by the new group allocation section, and configured to perform the dipping for the new group in the individual mode for each holding tool that holds the allocated component in a case where the components, of which number is the same as the number of holding tools, are not allocated as the components in the new group.

According to the present disclosure, in a case where a collective lifting and lowering scheduled group includes a component for which pickup is to be skipped, a component for which the pickup is not to be skipped in the collective lifting and lowering scheduled group is allocated in a new group, and in a case where the number of components allocated in the new group is the same as the number of suction nozzles, the dipping of the components in the new group into the coating agent can be performed in the collective mode. For this reason, it is possible to shorten the total time required for dipping all the components in need of dipping for mounting on the boards, as compared with a case where dipping into the coating agent for the components in the collective lifting and lowering scheduled group, for which the pickup is not to be skipped, is performed only in the individual mode.

BRIEF DESCRIPTION OF DRAWINGS

FIG. 6 is a block diagram of a control system for controlling the component mounting machine of the embodiment.

FIG. 7 is a diagram illustrating states before and after components are mounted on divided board sections in a case where a region of a board is divided into the divided board sections, as an embodiment.

FIG. 8 is a diagram illustrating a production job of FIG. 7.

FIG. 9 is a diagram illustrating states before and after components are mounted on divided board sections in a case where a region of a board is divided into the divided board sections, as another embodiment.

FIG. 10 is a diagram illustrating a production job of FIG. 9.

FIG. 11 is a diagram illustrating states before and after components are mounted on divided board sections in a case where components are not mounted on some divided board sections.

FIG. 12 is a diagram illustrating a production job of FIG. 11, and illustrates a comparative example in a case where processes of the embodiment are not applied.

FIG. 13 is a diagram illustrating a production job of FIG. 11, and illustrates a case in which processes of the embodiment are applied.

FIG. 17 is a diagram illustrating a production job of FIG. 16, and illustrates a case where processes of the embodiment are applied.

DESCRIPTION OF EMBODIMENTS

1. Configuration of Component Mounting Machine

Figure 1:
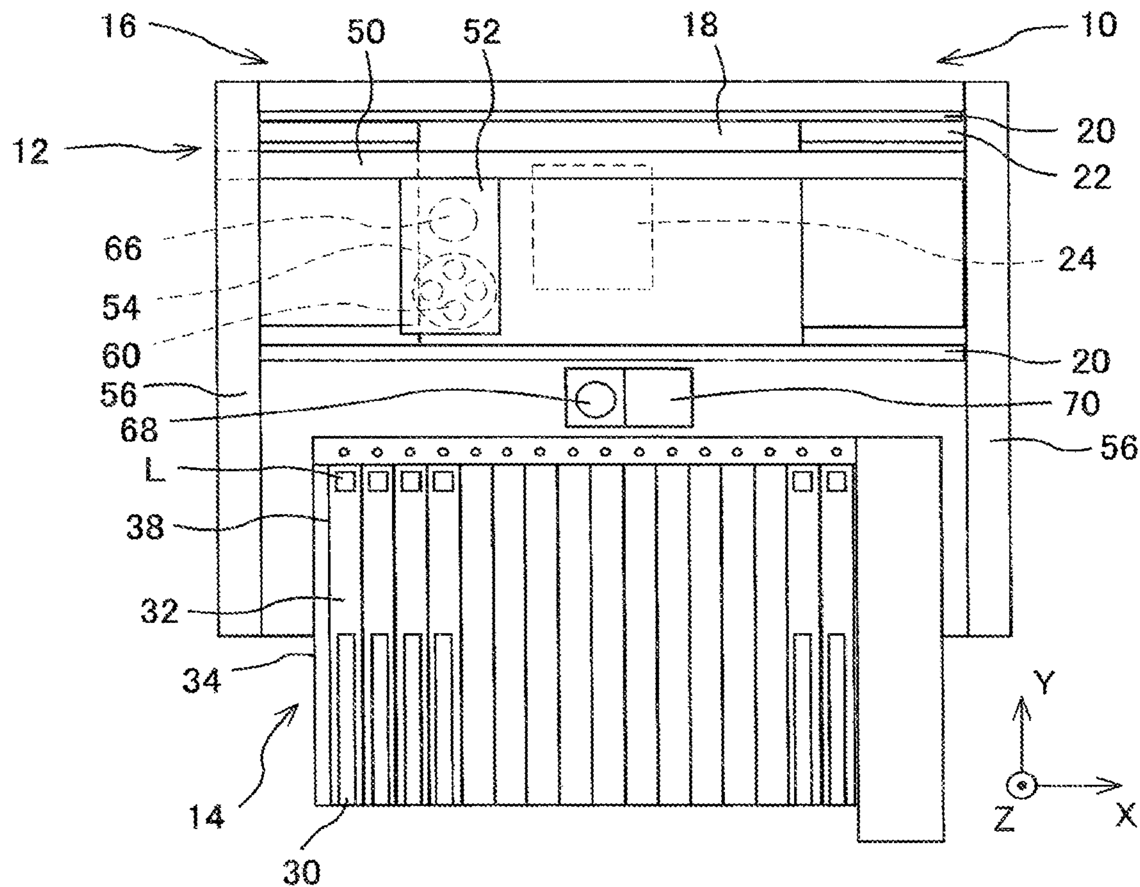
FIG. 1 is a top view of a component mounting machine according to an embodiment of the present disclosure.

A configuration of component mounting machine 10 according to an embodiment of the present disclosure will be described with reference to the drawings. Component mounting machine 10 is a device for transferring a component such as an electronic component to a board by using a holding tool, and is a device provided on a board production line. As illustrated in FIG. 1, component mounting machine 10 includes board conveyance section 12, component supply section 14, and component transfer section 16.

Board conveyance section 12 is a device for conveying board 18 such as a circuit board as a production target. Board conveyance section 12 includes a pair of guide rails 20, conveyor belt 22, and clamping device 24. Guide rails 20 are arranged in parallel with each other with a space therebetween. Guide rails 20 guide board 18 in conveyance direction X. Conveyor belt 22 is a belt member on which board 18 can be placed, and is rotatable. Board 18 is conveyed in conveyance direction X by conveyor belt 22 while being guided by pair of guide rails 20. Clamping device 24 is disposed at a predetermined component mounting position in conveyance direction X. Clamping device 24 is capable of clamping board 18. Board 18 is positioned by clamping device 24 when board 18 is conveyed to the predetermined component mounting position by conveyor belt 22.

Figure 2:
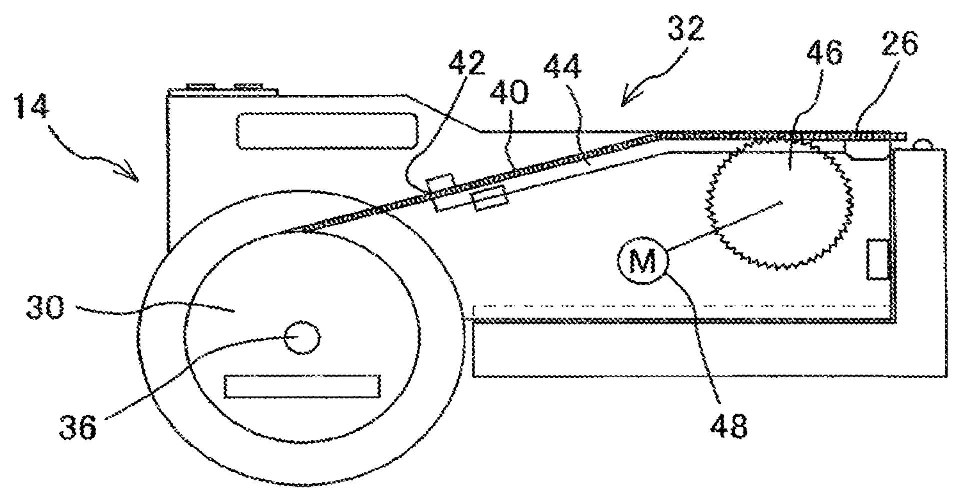
FIG. 2 is a configuration diagram of a tape feeder and a reel included in the component mounting machine of the embodiment.

Component supply section 14 is a device for supplying component 26 to be mounted on board 18 to predetermined component transfer position L. As illustrated in FIG. 2, component supply section 14 includes reel 30 and tape feeder 32. Reel 30 and tape feeder 32 are placed on loading table 34 that is detachable from component mounting machine 10. Loading table 34 has multiple reel holding sections 36 and multiple feeder holding sections 38.

Reel 30 is detachably and rotatably held by each reel holding section 36. Reel 30 is a rotating body around which carrier tape 40 accommodating multiple components 26 is wound. Carrier tape 40 accommodates multiple components 26. Reel 30 is provided for each type of component 26. Tape feeder 32 is detachably held by each feeder holding section 38. Tape feeder 32 is a device for feeding carrier tape 40 wound around reel 30 that is held by reel holding section 36. Tape feeder 32 includes sprocket 46 and electric motor 48.

After carrier tape 40 is inserted into tape insertion port 42, carrier tape 40 can be guided to guide rail 44 and be fed to predetermined component transfer position L side on a main body of tape feeder 32. Sprocket 46 is disposed on predetermined component transfer position L side, and is supported to be rotatable with respect to the main body of tape feeder 32. Teeth of sprocket 46 are inserted into and engage with sprocket holes of carrier tape 40 guided by guide rail 44. Sprocket 46 is rotationally driven by the rotation of electric motor 48. Electric motor 48 can rotationally drive sprocket 46 in a rotational direction in which carrier tape 40 is fed in a predetermined supply direction (specifically, in a direction from tape insertion port 42 side to predetermined component transfer position L side).

When sprocket 46 is rotationally driven by electric motor 48, carrier tape 40 is pulled out from reel 30 and is fed on guide rail 44 in the predetermined supply direction. In carrier tape 40, the cover tape is peeled off at a position near sprocket 46 on the upper surface of guide rail 44, so that component 26 accommodated in the base tape can be transferred by component transfer section 16. After component 26 has reached predetermined component transfer position L by carrier tape 40 being fed in the predetermined supply direction, component 26 is picked up by component transfer section 16 and is transferred toward board 18.

Component transfer section 16 is a device for transferring component 26 from predetermined component transfer position L toward board 18 positioned at the predetermined component mounting position. Component transfer section 16 includes Y-axis slider 50, X-axis slider 52, and mounting head 54.

Y-axis slider 50 is supported by guide rails 56. Guide rail 56 extends in a direction orthogonal to conveyance direction X of board 18 by board conveyance section 12 (hereinafter, referred to as orthogonal direction Y), and is disposed above board conveyance section 12. Y-axis slider 50 is movable in orthogonal direction Y. Y-axis slider 50 is connected to a Y-axis servomotor (not illustrated). The position of Y-axis slider 50 is moved along guide rail 56 in orthogonal direction Y by the driving of the Y-axis servomotor.

X-axis slider 52 is attached to Y-axis slider 50 so as to be movable in conveyance direction X. X-axis slider 52 is connected to an X-axis servomotor (not illustrated) fixed to Y-axis slider 50. The position of X-axis slider 52 is moved to in conveyance direction X by the driving of the X-axis servomotor.

Figure 3:
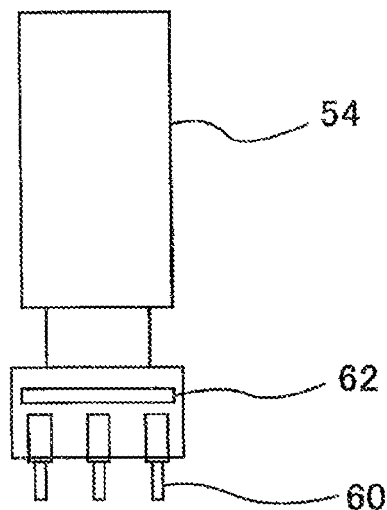
FIG. 3 is a configuration diagram of a mounting head and a suction nozzle included in the component mounting machine of the embodiment.

Mounting head 54 is attached to X-axis slider 52. As illustrated in FIG. 3, mounting head 54 holds suction nozzle 60 capable of picking up component 26. Mounting head 54 holds multiple suction nozzles 60 at equal intervals (intervals of 90 degrees) in a circumferential direction. Hereinafter, it is assumed that mounting head 54 holds four suction nozzles 60. Each suction nozzle 60 is a holding tool that picks up component 26, which is positioned at predetermined component transfer position L of component supply section 14, to a nozzle tip end (specifically, a lower end of the nozzle) by using negative pressure or the like, and mounts picked-up component 26 to board 18 that is positioned at the predetermined component mounting position by the suction release.

Figure 4:
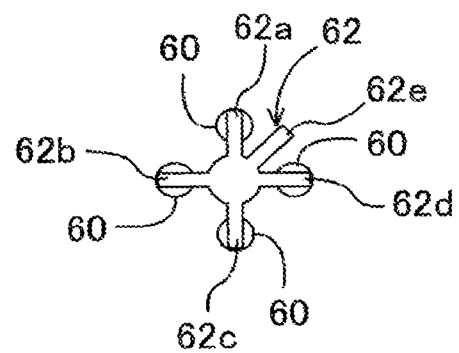
FIG. 4 is a diagram illustrating an orientation in a case where four suction nozzles are lifted and lowered at the same time, in which a nozzle lifting and lowering pusher is viewed from an axial direction.
Figure 5:
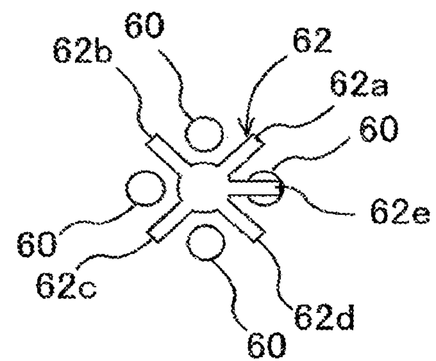
FIG. 5 is a diagram illustrating an orientation in a case where among four suction nozzles, only one suction nozzle is lifted and lowered, in which the nozzle lifting and lowering pusher is viewed from the axial direction.

Mounting head 54 includes nozzle lifting and lowering pusher 62. Nozzle lifting and lowering pusher 62 can be lifted or lowered with respect to mounting head 54 in up-down direction Z orthogonal to both conveyance direction X and orthogonal direction Y. Further, nozzle lifting and lowering pusher 62 is rotatable about an axis parallel to up-down direction Z. As illustrated in FIGS. 4 and 5, nozzle lifting and lowering pusher 62 includes four collective lifting and lowering sections 62_a_, 62_b_, 62_c_, and 62_d_ that are disposed at equal intervals (intervals of 90 degrees), and individual lifting and lowering section 62_e_ disposed at an angle position different from collective lifting and lowering sections 62_a_, 62_b_, 62_c_, and 62_d_.

As illustrated in FIG. 4, nozzle lifting and lowering pusher 62 is lifted and lowered in a state in which four collective lifting and lowering sections 62_a_, 62_b_, 62_c_, and 62_d_ are respectively positioned with four suction nozzles 60, and thereby all suction nozzles 60 are lifted and lowered collectively. On the other hand, as illustrated in FIG. 5, nozzle lifting and lowering pusher 62 is lifted and lowered in a state in which individual lifting and lowering section 62_e_ is positioned with one suction nozzle 60, and thereby corresponding one suction nozzle 60 is lifted and lowered independently of other suction nozzles 60. Mounting head 54 can select and execute, by driving nozzle lifting and lowering pusher 62, a collective mode in which all suction nozzles 60 are lifted and lowered collectively and an individual mode in which lifting and lowering is performed for each suction nozzle 60.

As illustrated in FIG. 1, board camera 66 is attached to X-axis slider 52. Board camera 66 captures an image of a reference mark of board 18 positioned at the predetermined component mounting position from above to acquire board position reference information, or captures an image of component 26 that has arrived at predetermined component transfer position L from above to acquire component position information. The component position information is used for position control and orientation control of suction nozzle 60 when component 26 is picked up by suction nozzle 60. The board position reference information is used for position control and orientation control of suction nozzle 60 when component 26 picked up by suction nozzle 60 is mounted on board 18.

Part camera 68 is attached to a base of component transfer section 16. Part camera 68 captures an image of component 26 picked up by suction nozzle 60 from below to acquire orientation information and the like of component 26. The orientation information is used for position control and orientation control of suction nozzle 60 when component 26 picked up by suction nozzle 60 of mounting head 54 is mounted on board 18.

Dip tank 70 is attached to the base of component transfer section 16. Dip tank 70 is provided to be adjacent to part camera 68. Dip tank 70 is a tank for storing a coating agent to be applied to component 26. Examples of the coating agent include a flux, a solder paste, and a silver paste.

Component mounting machine 10 is controlled by control section 80. More specifically, control section 80 is electrically connected to a driving section of board conveyance section 12, a driving section of component supply section 14, a driving section of component transfer section 16 (in particular, Y-axis slider 50, X-axis slider 52, and nozzle lifting and lowering pusher 62), board camera 66, part camera 68, and the like in component mounting machine 10. Control section 80 can control the operation of these driving sections and the like. The control of control section 80 is performed based on a production plan of board 18 using component mounting machine 10, an operation state of component mounting machine 10, and the like. The production plan includes a production plan of multiple types of board 18, and also includes a use plan indicating the types and the number of components 26 to be used in accordance with the production plan of board 18. This production plan is updated subsequently.

As illustrated in FIG. 6, memory section 82 is connected to control section 80. Memory section 82 stores production jobs. The production job includes an order of components to be mounted on the board. Further, the production job includes information on a group obtained by grouping four components 26 together, which are scheduled to be held by four suction nozzles 60 of mounting head 54 and to be applied with the coating agent at the same time in a case where the component is dipped into the coating agent. Hereinafter, this group is referred to as a collective lifting and lowering scheduled group.

The collective lifting and lowering scheduled group is an aggregate in which four components 26 are grouped together. Four components 26 in the collective lifting and lowering scheduled group have substantially the same height in up-down direction Z in order to position the lower surfaces of four components 26 at the same height during the dipping in the collective mode. Note that, the collective lifting and lowering scheduled group may be an aggregate of the same type of components 26 or may be an aggregate of different types of components 26 as long as components 26 have substantially the same height in up-down direction Z.

Memory section 82 stores multiple collective lifting and lowering scheduled groups. The multiple collective lifting and lowering scheduled groups may be aggregates having different heights in up-down direction Z, or may be aggregates having the same height in up-down direction Z, as the aggregate of four components 26 having substantially the same height in up-down direction Z. A predetermined order of use is assigned to the multiple collective lifting and lowering scheduled groups.

In addition, the production job stored in memory section 82 can include information on a group obtained by grouping components 26 together, which are scheduled to be held by suction nozzles 60 of mounting head 54 and to be applied with the coating agent at the same time, and are fewer than the number of suction nozzles 60 (specifically, four). Hereinafter, this group is referred to as an individual lifting and lowering scheduled group.

The individual lifting and lowering scheduled group is particularly an aggregate which appears at the end of production in which there are few components 26 to be used thereafter, for example, appears as a final group following the collective lifting and lowering scheduled group in a case where the number of components 26 to be used in the production of one board 18 is not a multiple of four. In a case where there is an individual lifting and lowering scheduled group, memory section 82 stores the individual lifting and lowering scheduled group together with the collective lifting and lowering scheduled group.

In the individual lifting and lowering scheduled group, it is not necessary for components 26 which are to be grouped to have substantially the same height in up-down direction Z, but components 26 to be grouped may have substantially the same height. Further, multiple individual lifting and lowering scheduled groups may be provided in accordance with the height of components 26 to be grouped in up-down direction Z. Further, in the individual lifting and lowering scheduled group, components 26 having different heights in up-down direction Z may be grouped together.

2. Operation of Component Mounting Machine 10

Next, the operation of component mounting machine 10 will be described. Component mounting machine 10 conveys board 18, on which components are not mounted yet, to the predetermined component mounting position by board conveyance section 12, and supplies component 26, which is to be mounted on board 18, to predetermined component transfer position L by component supply section 14. Then, component 26 is picked up by suction nozzle 60 of mounting head 54 of component transfer section 16 at predetermined component transfer position L, dipping is performed in which the coating agent of dip tank 70 is applied to picked-up component 26, then component 26 to which the coating agent has been applied is mounted on board 18 at the predetermined component mounting position.

Component mounting machine 10 repeatedly performs a pick-and-place cycle (hereinafter referred to as a PP cycle) multiple times, in which pickup of component 26 by suction nozzle 60, dipping of component 26 into the coating agent, and mounting of component 26 on board 18 are subsequently performed. Control section 80 repeatedly performs the PP cycle corresponding to the multiple collective lifting and lowering scheduled groups, and performs the PP cycle corresponding to the individual lifting and lowering scheduled group.

In the present embodiment, as illustrated in FIG. 7, an example is given in which the same type of component P is mounted on divided board sections which are obtained by dividing one board 18 into multiple regions. Board 18 on which component P is not mounted is illustrated on the left side of FIG. 7, and A to L in the drawing are divided board sections in which regions are allocated to board 18. Board 18 in a state in which components P are mounted is illustrated on the right side of FIG. 7, and the same type of component P is mounted on each of divided board sections A to L. Further, it is assumed that all components P are mounted on respective divided board sections A to L after being dipped into the coating agent.

In the production job in this case, as illustrated in FIG. 8, for example, components P are mounted in the order of divided board sections A to L. According to the production job, four suction nozzles 60 respectively pick up components P, four suction nozzles 60 perform the dipping at the same time in a state of holding the components, then components P are mounted at the predetermined mounting positions.

In 1PP cycle, a collective lifting and lowering scheduled group, in which four components P corresponding to divided board sections A to D are grouped, is set. Similarly, in 2PP cycle, a collective lifting and lowering scheduled group, in which four components P corresponding to divided board sections E to H are grouped, is set, and in 3PP cycle, a collective lifting and lowering scheduled group, in which four components P corresponding to divided board sections I to L are grouped, is set. In this case, control section 80 executes the PP cycle according to the following procedure if it is as scheduled.

That is, after four components P corresponding to divided board sections A to D are picked up by four suction nozzles 60 in 1PP cycle, control section 80 lifts and lowers, in up-down direction Z, nozzle lifting and lowering pusher 62 in a state where nozzle lifting and lowering pusher 62 is positioned in the orientation illustrated in FIG. 4 to thereby lift and lower four suction nozzles 60 collectively. In this manner, four components P held by suction nozzles 60 are dipped into the coating agent in the collective mode, and four components P to which the coating agent has been applied are respectively mounted on corresponding divided board sections A to D of board 18.

Similarly, in 2PP cycle and 3PP cycle, control section 80 picks up four components P corresponding to divided board sections E to H (or I to L) by using four suction nozzles 60, and then lifts and lowers four suction nozzles 60 collectively. In this manner, four components P held by suction nozzles 60 are dipped into the coating agent in the collective mode, and four components P to which the coating agent has been applied are respectively mounted on corresponding divided board sections E to H (or I to L) of board 18.

The lifting and lowering movement amount of four suction nozzles 60 in the collective mode is changed in accordance with the height of component P, which is to be picked up by suction nozzle 60, in up-down direction Z, and is set in advance for each collective lifting and lowering scheduled group. In the dipping in the collective mode in each PP cycle described above, lifting and lowering in correspondence with the lifting and lowering movement amount of the collective lifting and lowering scheduled group are performed.

According to such processing, the mounting of twelve components P on divided board sections A to L can be achieved by three PP cycles using four suction nozzles 60 of mounting head 54, and the dipping of four components P in the collective lifting and lowering scheduled group into the coating agent can be achieved by lifting and lowering four suction nozzles 60 in the collective mode. Therefore, it is possible to shorten the processing time required for dipping four components P in the collective lifting and lowering scheduled group into the coating agent, and it is possible to mount components P on divided board sections A to L in a short time.

Further, for example, as illustrated in FIG. 9, in a case where components P are mounted on divided board sections A to K, it is assumed that a collective lifting and lowering scheduled group, in which four components P corresponding to divided board sections A to D are grouped, is set in 1PP cycle, a collective lifting and lowering scheduled group, in which four components P corresponding to divided board sections E to H are grouped, is set in 2PP cycle, and an individual lifting and lowering scheduled group in which three components P corresponding to divided board sections I to K are grouped, is set in 3PP cycle. In this case, control section 80 executes the PP cycle according to the following procedure if it is as scheduled.

That is, as illustrated in FIG. 10, in 1PP cycle and 2PP cycle, control section 80 picks up four components P corresponding to divided board sections A to D (or E to H) by using suction nozzles 60 in the same manner as the example shown in FIG. 8, and then lifts and lowers, in up-down direction Z, nozzle lifting and lowering pusher 62 in a state where nozzle lifting and lowering pusher 62 is positioned in the orientation illustrated in FIG. 4 to thereby lift and lower four suction nozzles 60 collectively. In this manner, four components P held by suction nozzles 60 are dipped into the coating agent in the collective mode, and four components P to which the coating agent has been applied are respectively mounted on corresponding divided board sections A to D (or E to H) of board 18.

Next, in 3PP cycle, control section 80 picks up three components P, corresponding to divided board sections I to K, by using any three suction nozzles 60 of mounting head 54, and then control section 80 subsequently positions nozzle lifting and lowering pusher 62 to the orientation illustrated in FIG. 5 and lifts and lowers nozzle lifting and lowering pusher 62 in up-down direction Z, in a way such that three suction nozzles 60 holding three components P are respectively lifted and lowered. In this manner, three components P held by suction nozzles 60 are dipped into the coating agent in the individual mode, and three components P to which the coating agent has been applied are respectively mounted on corresponding divided board sections I to K of board 18.

According to such processing, the mounting of eleven components P on divided board sections A to K can be achieved by three PP cycles using suction nozzles 60 of mounting head 54. In two PP cycles, the dipping of four components P in the collective lifting and lowering scheduled group into the coating agent can be achieved by lifting and lowering four suction nozzles 60 in the collective mode. In the remaining one PP cycle, the dipping of three components P in the individual lifting and lowering scheduled group into the coating agent can be achieved by lifting and lowering three suction nozzles 60 in the individual mode.

Therefore, since the dipping for the collective lifting and lowering scheduled group is performed in the collective mode, it is possible to shorten the processing time required for dipping four components P into the coating agent. In addition, since the dipping for the individual lifting and lowering scheduled group is performed in the individual mode, unlike in the collective mode, in a case where component P picked up by suction nozzle 60 is dipped into the coating agent, it is possible to reliably prevent the coating agent from adhering to the tip end of other suction nozzles 60 that are not holding component P, and this makes it possible to avoid labor required for repairing suction nozzle 60 such as removal of the coating agent adhering to the tip end.

Note that, initially, components P are scheduled to be mounted on divided board sections A to L as illustrated in FIG. 7, but as illustrated in FIG. 11, since some divided board sections (for example, divided board sections C and F) have some factor such as scratches, the mounting of components P on corresponding divided board sections C and F may be skipped and components P may not be mounted. This skip may occur after the production job is created, or may occur after the collective lifting and lowering scheduled group and the individual lifting and lowering scheduled group are stored in memory section 82. For example, as illustrated in FIG. 12, in the production job, skip information (indicated by the symbol "S" in the drawing) is recorded as items corresponding to divided board sections C and F, and component P, corresponding to divided board section C in the collective lifting and lowering scheduled group in 1PP cycle, and component P, corresponding to divided board section F in the collective lifting and lowering scheduled group in 2PP cycle, are selected as non-mount components, such that pickup of corresponding components P by suction nozzles 60 is skipped In a situation in which the pickup is skipped as illustrated in FIG. 12, in order to prevent the coating agent from adhering to suction nozzles 60 which were scheduled to pick up components P corresponding to divided board sections C and F at the time of performing the dipping, it is conceivable to execute the dipping of remaining components P into the coating agent in the individual mode in 1PP cycle and 2PP cycle.

Specifically, in 1PP cycle, control section 80 may pick up three components P except for component P corresponding to divided board section C by using any three suction nozzles 60 of mounting head 54, and then subsequently position, and lift and lower nozzle lifting and lowering pusher 62 in the up-down direction such that three suction nozzles 60 holding three components P are respectively lifted and lowered. In this manner, the dipping of three components P held by suction nozzles 60 into the coating agent is performed in the individual mode, and three components P to which the coating agent has been applied are respectively mounted on divided board sections A, B, and D of board 18. Then, in 2PP cycle, three components P except for component P corresponding to divided board section F may be picked up by any three suction nozzles 60 of mounting head 54, and then nozzle lifting and lowering pusher 62 may be subsequently positioned, and lifted and lowered in up-down direction Z such that three suction nozzles 60 holding three components P are respectively lifted and lowered. In this manner, the dipping of three components P held by suction nozzles 60 into the coating agent is performed in the individual mode, and three components P to which the coating agent has been applied are respectively mounted on divided board sections E, G, and H of board 18. According to such a configuration, it is possible to apply the coating agent to held component P while preventing the coating agent from adhering to suction nozzles 60 which were scheduled to pick up components P corresponding to divided board sections C and F at the time of performing the dipping.

The time for lifting and lowering suction nozzle 60 hardly changes between one time of dipping in the collective mode and one time of dipping in the individual mode. Hereinafter, it is assumed that the time for lifting and lowering suction nozzle 60 is 1 second, for example, in both the collective mode and the individual mode. Assuming that the dipping in which the coating agent is applied to components P in the collective lifting and lowering scheduled group is executed in the collective mode as scheduled in FIG. 8, the total time required for the dipping in three PP cycles is 3 seconds because the time required for the dipping in each of 1PP cycle to 3PP cycle is 1 second.

On the other hand, in a situation in which the pickup is skipped as illustrated in FIG. 12, in a case where the dipping in which the coating agent is applied to remaining components P in the collective lifting and lowering scheduled group is performed in the individual mode, the time required for the dipping in 1PP cycle is 3 seconds, the time required for the dipping in 2PP cycle is 3 seconds, and the time required for the dipping in 3PP cycle is 1 second, so that the total time required for the dipping in three PP cycles is 7 seconds. For this reason, as the number of the collective lifting and lowering scheduled groups including component P for which the picking-up is to be skipped increases, the total time required for the dipping in all PP cycles increases, and the time from the start of the production of divided board sections A to L of board 18 to the end of the production increases.

Figure 14:
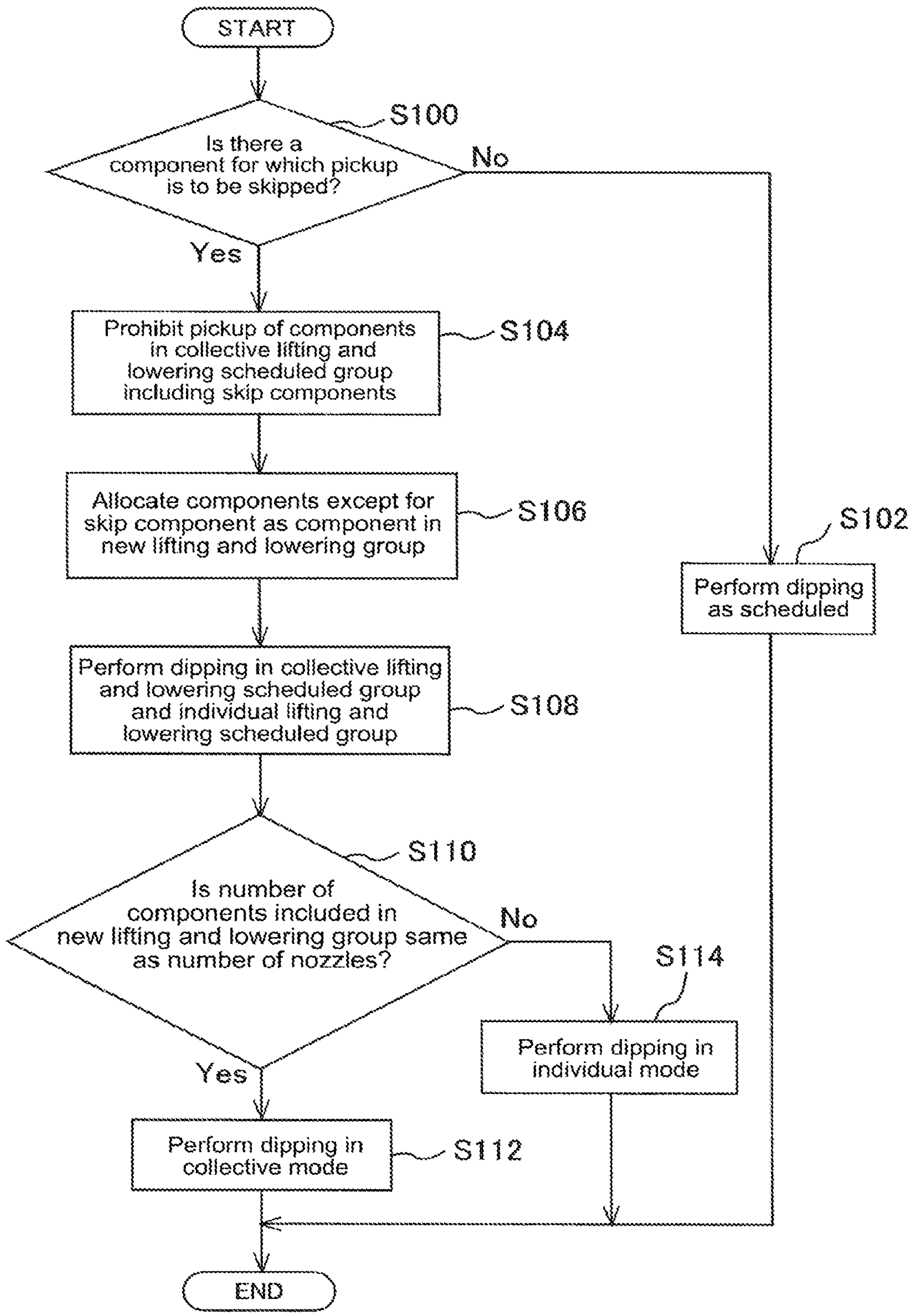
FIG. 14 is a flowchart illustrating an example of a control routine executed in the embodiment.

Therefore, in the present embodiment, control section 80 performs the following processing. That is, in the board production, first, in step S100 in the routine illustrated in FIG. 14, control section 80 causes skip determination section 80*a* to determine whether the pickup by suction nozzle 60 is to be skipped for each component P allocated in the collective lifting and lowering scheduled group (which may include the individual lifting and lowering scheduled group; the same applies hereinafter) stored in memory section 82. This determination is performed before suction nozzle 60 picks up component P. In a case where it is determined that component P for which the pickup is to be skipped is not included in the collective lifting and lowering scheduled group, in step S102, control section 80 causes collective dip control section 80*b* to perform the dipping of components P into the coating agent in the collective mode for each collective lifting and lowering scheduled group stored in memory section 82 as scheduled. In a case where there is an individual lifting and lowering scheduled group, individual dip control section 80*c* performs the dipping of component P in the individual lifting and lowering scheduled group into the coating agent in the individual mode.

Meanwhile, in a case where it is determined that component P for which pickup is to be skipped is included in the collective lifting and lowering scheduled group, in step S104, control section 80 causes new group allocation section 80*d* to prohibit pickup of components P in the collective lifting and lowering scheduled group including component P for which pickup is to be skipped, by suction nozzles 60. Further, in step S106, new group allocation section 80*d* sets, as a recovery component, remaining components P except for component P for which pickup is to be skipped in the collective lifting and lowering scheduled group, and allocates the recovery component as component P in a new lifting and lowering group.

The above-mentioned new lifting and lowering group is an aggregate in which the recovery components are to be grouped, and the maximum number of recovery components to be grouped in the new lifting and lowering group is the same as the number of suction nozzles 60 held by mounting head 54. In a case where the number of recovery components exceeds the number of suction nozzles 60 held by mounting head 54, another new lifting and lowering group is newly created. In the new lifting and lowering group, the recovery components having substantially the same height in up-down direction Z are to be grouped, and the height of the recovery components, which are to be grouped as components P in each new lifting and lowering group, in up-down direction Z may be the same or different between new lifting and lowering groups.

The new lifting and lowering group created as described above is stored in memory section 82. The new lifting and lowering group is set such that the PP cycles for the new lifting and lowering group are performed following the PP cycles for the collective lifting and lowering scheduled group and the individual lifting and lowering scheduled group, which are determined in advance. For the new lifting and lowering group, the lifting and lowering movement amount of four suction nozzles 60 in the collective mode is changed in accordance with the height of component P, which is to be picked up by suction nozzle 60, in up-down direction Z, and is set for each new lifting and lowering group.

For example, as illustrated in FIG. 13, similarly to the case illustrated in FIG. 12, component P corresponding to divided board section C in the collective lifting and lowering scheduled group in 1PP cycle and component P corresponding to divided board section F in the collective lifting and lowering scheduled group in 2PP cycle are selected as non-mount components, and pickup of corresponding components P by suction nozzles 60 is skipped. In this situation, control section 80 prohibits pickup of all components P by suction nozzles 60 in the collective lifting and lowering scheduled group in each of 1PP cycle and 2PP cycle. Further, components P corresponding to divided board sections A, B, and D in the collective lifting and lowering scheduled group in 1PP cycle and components P corresponding to divided board sections E, G, and H in the collective lifting and lowering scheduled group in 2PP cycle are set as the recovery components. Control section 80 allocates corresponding components P as components P in the new lifting and lowering group. In this case, since the number of recovery components is six, a new lifting and lowering group in which four components P (specifically, components P corresponding to divided board sections A, B, D, and E) of which the number is the same as the number of suction nozzles 60 of mounting head 54 are grouped is set in 4PP cycle. Further, a new lifting and lowering group in which other two components P (specifically, components P corresponding to divided board sections G and H) which are smaller than the number of suction nozzles 60 of mounting head 54 are grouped is set in 5PP cycle.

After the new lifting and lowering group is set as described above, in step S108, control section 80 causes collective dip control section 80*b* to perform the dipping of components P in the collective lifting and lowering scheduled group not including component P for which pickup is to be skipped, into the coating agent, and causes, in a case where there is an individual lifting and lowering scheduled group, individual dip control section 80*c* to perform the dipping of components P in the individual lifting and lowering scheduled group into the coating agent. Thereafter, new group dip control section 80*e* performs the dipping of components P in the new lifting and lowering group into the coating agent.

Specifically, when new group dip control section 80*e* tries to perform the dipping, first, in step S110, control section 80 determines whether components P of which the number is the same as the number of suction nozzles 60 of mounting head 54 are allocated as the components in the new lifting and lowering group. As a result, in a case where it is determined that the number of components P in the new lifting and lowering group is the same as the number of suction nozzles 60, in step S112, the dipping of components P in the new lifting and lowering group into the coating agent is performed in the collective mode. On the other hand, in a case where it is determined that the number of components P in the new lifting and lowering group is smaller than the number of suction nozzles 60, in step S114, the dipping of components Pin the new lifting and lowering group into the coating agent is performed in the individual mode.

For example, in the case illustrated in FIG. 13, after both the PP cycles in the collective lifting and lowering scheduled groups in 1PP cycle and 2PP cycle are inhibited, the PP cycle of 3PP cycle is executed, and then the PP cycles of 4PP cycle and 5PP cycle are executed. Control section 80 performs the dipping of components P corresponding to divided board sections I to L in 3PP cycle into the coating agent in the collective mode. The control section performs the dipping of components P corresponding to divided board sections A, B, D, and E in 4PP cycle into the coating agent in the collective mode. Finally, control section 80 performs the dipping of components P corresponding to divided board sections G and H in 5PP cycle into the coating agent in the individual mode.

According to this processing, since pickup of the component by suction nozzle 60 in 1PP cycle and 2PP cycle is prohibited, the time required for the dipping in each of 1PP cycle and 2PP cycle is 0 seconds, the time required for the dipping in each of 3PP cycle and 4PP cycle is 1 second, and the time required for the dipping in 5PP cycle is 2 seconds, so that the total time required for the dipping in all the PP cycles is 4 seconds.

As described above, in a case where component P for which pickup is to be skipped is included in the collective lifting and lowering scheduled group, since remaining components P are set as the recovery components, and a new lifting and lowering group, in which the recovery components are grouped and for which the dipping is performed in the collective mode, is created, it is possible to shorten the time required for the dipping of all components P, which are to be mounted on board 18 and are required to be dipped into the coating agent, as compared with a case where the dipping of remaining components P in the collective lifting and lowering scheduled group into the coating agent is performed in the individual mode.

Therefore, according to the present embodiment, in a case where pickup of component P by suction nozzle 60 is skipped due to some factor, it is possible to shorten the time required for the dipping as much as possible while the dipping of applying the coating agent to all required components P is reliably executed.

3. Effects of Above-Described Embodiment

As is obvious from the above description, component mounting machine 10 of the present embodiment includes: mounting head 54 that holds multiple suction nozzles 60 each of which is capable of holding component P, and that can select and execute an individual mode in which lifting and lowering is performed for each suction nozzle 60 and a collective mode in which all suction nozzles 60 are lifted and lowered collectively; memory section 82 that stores multiple groups, which are grouped in advance and in each of which components P of which the number is the same as the number of suction nozzles 60 of mounting head 54, as a collective lifting and lowering scheduled group; and control section 80 that subsequently executes pickup of component P by suction nozzle 60, dipping of component P into the coating agent, and mounting of component P on board 18.

Control section 80 includes collective dip control section 80*b* that performs the dipping of components P in the collective lifting and lowering scheduled group in the collective mode in a case where component P for which pickup by suction nozzle 60 is to be skipped is not included in the collective lifting and lowering scheduled group; new group allocation section 80*d* that prohibits pickup of component P by suction nozzle 60 in the collective lifting and lowering scheduled group and allocates component P, for which pickup by suction nozzle 60 is not to be skipped, in the collective lifting and lowering scheduled group, as the component in the new lifting and lowering group in a case where component P for which pickup by suction nozzle 60 is to be skipped is included in the collective lifting and lowering scheduled group; and new group dip control section 80*e* that, in a case where components P of which the number is the same as the number of suction nozzles 60 of mounting head 54 are allocated as the components in the new lifting and lowering group by the new group allocation section, performs the dipping of components P in the new lifting and lowering group in the collective mode, and in a case where components P of which the number is the same as the number of suction nozzles 60 are not allocated as the components in the new lifting and lowering group, performs the dipping of component P in the new lifting and lowering group in the individual mode for each suction nozzle 60 holding allocated component P.

According to this configuration, in a case where component P for which pickup is to be skipped is included in the collective lifting and lowering scheduled group, component P for which pickup is not to be skipped in the collective lifting and lowering scheduled group is allocated in the new lifting and lowering group, and in a case where the number of components P allocated in the new lifting and lowering group is the same as the number of suction nozzles 60, the dipping of components P in the new lifting and lowering group into the coating agent can be performed in the collective mode. For this reason, it is possible to shorten the time required for the dipping of all components P, which are to be mounted on board 18 and are required to be dipped into the coating agent, as compared with a case where the dipping of components P, for which pickup is not to be skipped, in the collective lifting and lowering scheduled group into the coating agent is performed in the individual mode.

Further, in component mounting machine 10, memory section 82 further stores a group in which components P of which the number is smaller than the number of suction nozzles 60 of mounting head 54 are grouped in advance, as an individual lifting and lowering scheduled group, and control section 80 further includes individual dip control section 80*c* that performs the dipping of components P in the individual lifting and lowering scheduled group in the individual mode.

According to this configuration, in a case where there is an individual lifting and lowering scheduled group in which components P of which the number is smaller than the number of suction nozzles 60 of mounting head 54 are grouped, the dipping of components P in the individual lifting and lowering scheduled group can be reliably executed.

Further, in component mounting machine 10, control section 80 further includes skip determination section 80*a* that determines whether component P for which pickup by suction nozzle 60 is to be skipped is included in the collective lifting and lowering scheduled group, before pickup by suction nozzle 60 in the collective lifting and lowering scheduled group.

According to this configuration, since whether component P for which pickup is to be skipped is included in the collective lifting and lowering scheduled group is determined before pickup of component P by suction nozzle 60 in the collective lifting and lowering scheduled group, in a case where component P for which pickup is to be skipped is included in the collective lifting and lowering scheduled group, it is possible to avoid a situation in which the dipping of component is performed in the collective mode in the collective lifting and lowering scheduled group.

Further, in component mounting machine 10, the group in which components P are grouped as the collective lifting and lowering scheduled group and the new lifting and lowering group (which may further include the individual lifting and lowering scheduled group) is an aggregate in which components P of the same type are grouped. Therefore, in component mounting machine 10, the group in which components P are grouped as the collective lifting and lowering scheduled group and the new lifting and lowering group (which may further include the individual lifting and lowering scheduled group) is an aggregate in which components P having the same height in the lifting and lowering direction of suction nozzle 60 are grouped.

According to this configuration, since the lower surfaces of respective components P in the group can be positioned at the same height, the dipping of respective components P can be appropriately performed in the collective mode.

In component mounting machine 10, the lifting and lowering movement amount of suction nozzle 60 in the collective mode is set for each collective lifting and lowering scheduled group and for each new lifting and lowering group. According to this configuration, since the lifting and lowering movement amount of suction nozzle 60 in the collective mode can be changed for each group, dipping of components P in the collective mode can be appropriately performed in correspondence with the lifting and lowering movement amount for each group.

4. First Alternative Embodiment

In the above-described embodiment, in a case where component P for which pickup is to be skipped is included in the collective lifting and lowering scheduled group, remaining components P, for which pickup is not to be skipped, except for component P for which pickup is to be skipped in the collective lifting and lowering scheduled group are allocated as components P in the new lifting and lowering group newly created separately from the individual lifting and lowering scheduled group. However, the present disclosure is not limited to this, and when the individual lifting and lowering scheduled group is already stored in memory section 82, components P for which pickup is not to be skipped in the collective lifting and lowering scheduled group may be allocated as components in the individual lifting and lowering scheduled group to which one or more components P can be allocated. That is, the allocation of components P for which pickup is not to be skipped in the collective lifting and lowering scheduled group may be started from the allocation to components P in the individual lifting and lowering scheduled group.

The allocation of components P (that is, recovery components), for which pickup is not to be skipped, in the collective lifting and lowering scheduled group, as components P in the individual lifting and lowering scheduled group may be started, in a case where there is an individual lifting and lowering scheduled group in which components P having substantially the same height in up-down direction Z as the height of the recovery components in up-down direction Z, from the individual lifting and lowering scheduled group, and may not be performed in a case where there is no such individual lifting and lowering scheduled group. In a case where there is no such individual lifting and lowering scheduled group, the allocation of the recovery components may be started from the allocation to components P in the newly created new lifting and lowering group, similarly to the processing of the above embodiment.

Figures 15, 16:
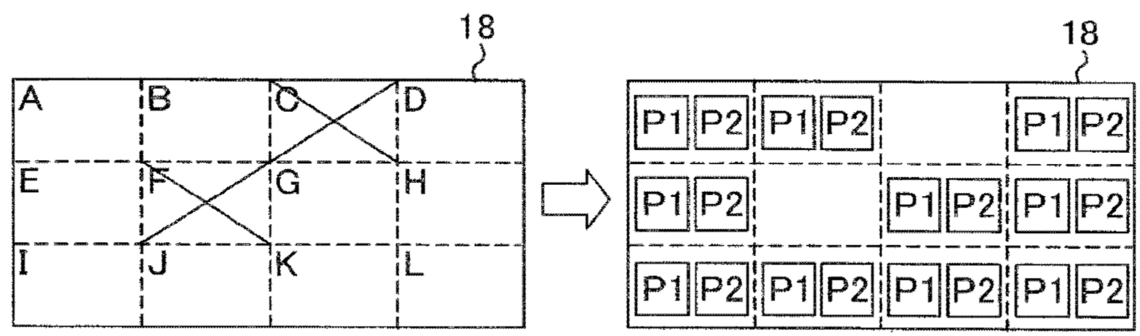
FIG. 15 is a diagram illustrating a production job of a first modification example of the embodiment, and illustrates a case in which components are not mounted in some divided board sections in the production job illustrated in FIG. 10.
FIG. 16 is a diagram illustrating states before and after components are mounted on divided board sections in a case where a region of a board is divided into the divided board sections, as a second modification example of the embodiment.

For example, as illustrated in FIG. 15, similarly to the case illustrated in FIG. 10, in a case where eleven components P are mounted on divided board sections A to K of board 18, component P corresponding to divided board section C in the collective lifting and lowering scheduled group in 1PP cycle and component P corresponding to divided board section F in the collective lifting and lowering scheduled group in 2PP cycle are selected as non-mount components, and pickup of corresponding components P by suction nozzles 60 is skipped. In this situation, components P corresponding to divided board sections A, B, and D in the collective lifting and lowering scheduled group in 1PP cycle and components P corresponding to divided board sections E, G, and H in the collective lifting and lowering scheduled group in 2PP cycle are set as the recovery components (indicated by “R” in the recovery information column in the drawing).

Control section 80 starts the allocation of the recovery components, from the allocation to fourth component P in the individual lifting and lowering scheduled group in 3PP cycle. In this case, a new lifting and lowering group which is changed from the individual lifting and lowering scheduled group and in which four components P (specifically, components P corresponding to divided board sections I, J, K, and A) of which the number is the same as the number of suction nozzles 60 of mounting head 54 are grouped is set in 3PP cycle. A new lifting and lowering group in which four components P (specifically, components P corresponding to divided board sections B, D, E, and G) of which the number is the same as the number of suction nozzles 60 of mounting head 54 are grouped is set in 4PP cycle. Further, a new lifting and lowering group including one component P (specifically, component P corresponding to divided board section H) of which the number is smaller than the number of suction nozzles 60 of mounting head 54 is set in 5PP cycle.

According to this modification, the number of components P in the individual lifting and lowering scheduled group for which dipping is normally performed in the individual mode can be increased, and can match the number of suction nozzles 60 of mounting head 54. Therefore, in a case where the number of components P in the individual lifting and lowering scheduled group matches the number of suction nozzles 60 of mounting head 54, the dipping for the group can be performed in the collective mode, so that it is possible to shorten the time required for the dipping of all components P which are to be mounted on board 18 and are required to be dipped into the coating agent.

For example, in the case illustrated in FIG. 10, in a case where the processing of the above embodiment is applied, the time required for the dipping in each of 1PP cycle and 2PP cycle is 0 seconds, the time required for the dipping in 3PP cycle is 3 seconds, the time required for the dipping in 4PP cycle is 1 second, and the time required for the dipping in 5PP cycle is 2 seconds, so that the total time required for the dipping in all the PP cycles is 6 seconds (not illustrated). In contrast, according to the processing of the first modification example described above, as illustrated in FIG. 15, the time required for the dipping in each of 1PP cycle and 2PP cycle is 0 seconds, the time required for the dipping in each of 3PP cycle and 4PP cycle is 1 second, and the time required for the dipping in 5PP cycle is 1 second, so that the total time required for the dipping in all the PP cycles is 3 seconds.

5. Second Alternative Embodiment

In the above embodiment, one type of component P is mounted on each of divided board sections A to L. As illustrated in FIG. 16, multiple types of components P1 and P2 may be mounted on each of divided board sections A to L. Here, components P1 and P2 have different heights. Therefore, component P1 and component P2 cannot be dipped into the coating agent at the same time.

The production job is as illustrated in FIG. 17. The initial production job includes 1PP cycle to 6PP cycle in FIG. 17. That is, components P1 are mounted on divided board sections A to D in 1PP cycle, and components P2 are mounted on divided board sections A to D in 2PP cycle. Subsequently, components P1 and P2 are subsequently mounted on divided board sections E to H in 3PP cycle and 4PP cycle, and components P1 and P2 are subsequently mounted on divided board sections I to L in 5PP cycle and 6PP cycle.

Here, it is assumed that components P1 and P2 corresponding to divided board sections C and F are set as skip components. Therefore, remaining components P1 and P2 included in 1PP cycle to 4PP cycle are set as the recovery components. In 7PP cycle, dipping of components P1 corresponding to divided board sections A, B, D, and E into the coating agent is performed in the collective mode, and in 8PP cycle, dipping of remaining components P1 corresponding to divided board sections G and H into the coating agent is performed in the individual mode. Since components P1 and P2 have different heights, dipping of components P1 and P2 into the coating agent cannot be performed at the same time. Therefore, only components P1 are grouped and allocated to the components in the new lifting and lowering group.

Subsequently, in 9PP cycle, dipping of components P2 corresponding to divided board sections A, B, D, and E into the coating agent is performed in the collective mode, and in 10PP cycle, dipping of remaining components P2 corresponding to divided board sections G and H into the coating agent is performed in the individual mode. Here, only components P2 are grouped and allocated to the components in the new lifting and lowering group.

According to this processing, since pickup of the components by suction nozzle 60 from 1PP cycle to 4PP cycle is prohibited, the time required for the dipping each of 1PP cycle to 4PP cycle becomes 0 seconds. The time required for the dipping in each of 5PP cycle and 6PP cycle is 1 second. The time required for the dipping in 7PP cycle after the recovery is 1 second, and the time required for the dipping in 8PP cycle after the recovery is 2 seconds. The time required for the dipping in 9PP cycle is 1 second, and the time required for the dipping in 10PP cycle is 2 seconds. The total time required for the dipping in all the PP cycles is 8 seconds.

In a case where component P1 and component P2 have the same height, all the components in 7PP cycle to 10PP cycle in FIG. 17 can be grouped. For example, the components in 9PP cycle and 10PP cycle can be advanced. In this case, the production job ends in 9PP cycle.

6. Others

In an above embodiment, mounting head 54 holds multiple suction nozzles 60 for picking up component P by negative pressure or the like, and component P is picked up by suction nozzle 60. However, the present disclosure is not limited to this; mounting head 54 may hold multiple chuck members or gripping members for chucking or gripping components 26, P, P1, and P2, and components 26, P, P1, and P2 may be chucked or gripped by these members; and components 26, P, P1, and P2 may be held by holding members held by mounting head 54.

In the above embodiment, components 26, P, P1, and P2 are mounted on divided board sections A to L. However, the present disclosure is not limited to this, and the skip component may be set due to some factor in a case where the component 26 to be mounted on board 18 is dipped into the coating agent. The present disclosure is similarly applied to, for example, a case where a skip component is set due to a component shortage. It should be noted that the present disclosure is not limited to the above-described embodiments and modification example, and various modifications can be made without departing from the spirit and scope of the present disclosure.

REFERENCE SIGNS LIST

10: component mounting machine
18: board
26, P, P1, P2: component
54: mounting head
60: suction nozzle
62: nozzle lifting and lowering pusher
70: dip tank
80: control section
80*a*: skip determination section
80*b*: collective dip control section
80*c*: individual dip control section
80*d*: new group allocation section
80*e*: new group dip control section
82: memory section

The invention claimed is:

1. A component mounting machine comprising:

a mounting head configured to hold multiple holding tools each of which is configured to hold a component, and select and execute an individual mode, in which lifting and lowering is performed for each holding tool, and a collective mode, in which all the holding tools are lifted and lowered collectively;

a memory section configured to store multiple groups, which are grouped in advance and in each of which the number of the components is the same as the number of holding tools, as a collective lifting and lowering scheduled group; and a control section configured to subsequently execute holding of the components by the holding tools, dipping of the components into a coating agent, and mounting of the components on a board, wherein the control section includes:

a collective dip control section configured to perform the dipping for the collective lifting and lowering scheduled group in the collective mode in a case where a component for which the holding by the holding tool is to be skipped is not included in the collective lifting and lowering scheduled group, a new group allocation section configured to prohibit the holding of the component by the holding tool in the collective lifting and lowering scheduled group, in a case where the component for which the holding by the holding tool is to be skipped is included in the collective lifting and lowering scheduled group, and allocate the component for which the holding by the holding tool is not to be skipped in the collective lifting and lowering scheduled group, as the component in a new group, and a new group dip control section configured to perform the dipping for the new group in the collective mode, in a case where the components, of which number is the same as the number of holding tools, are allocated as the components in the new group by the new group allocation section, and configured to perform the dipping for the new group in the individual mode for each holding tool that holds the allocated component in a case where the components, of which number is the same as the number of holding tools, are not allocated as the components in the new group.

2. The component mounting machine according to claim 1, wherein the memory section further stores a group in which the components of which the number is smaller than the number of holding tools are grouped in advance, as an individual lifting and lowering scheduled group, and wherein the control section further includes an individual dip control section configured to perform the dipping for the individual lifting and lowering scheduled group in the individual mode.

3. The component mounting machine according to claim 2, wherein the new group allocation section starts allocation of the component for which the holding by the holding tool is not to be skipped in the collective lifting and lowering scheduled group, from allocation to the component in the individual lifting and lowering scheduled group.

4. The component mounting machine according to claim 1, wherein the control section further includes a skip determination section configured to determine whether the component for which the holding by the holding tool is to be skipped is included in the collective lifting and lowering scheduled group, before the holding by the holding tool for the collective lifting and lowering scheduled group.

5. The component mounting machine according to claim 1, wherein the group in which the components are grouped is an aggregate in which components having the same height in a lifting and lowering direction of the holding tool are grouped.

6. The component mounting machine according to claim 1, wherein the group in which the components are grouped is an aggregate in which the same type components are grouped.

7. The component mounting machine according to claim 1, wherein a lifting and lowering movement amount of the holding tool in the collective mode is set for each collective lifting and lowering scheduled group and for each new group.

* * * * *